US010193065B2

(12) United States Patent
Dang et al.

(10) Patent No.: US 10,193,065 B2
(45) Date of Patent: Jan. 29, 2019

(54) HIGH K SCHEME TO IMPROVE RETENTION PERFORMANCE OF RESISTIVE RANDOM ACCESS MEMORY (RRAM)

(71) Applicant: Taiwan Semiconductor Manufacturing Co., Ltd., Hsin-Chu (TW)

(72) Inventors: Trinh Hai Dang, Hsinchu (TW); Hsing-Lien Lin, Hsin-Chu (TW); Chin-Wei Liang, Zhubei (TW); Cheng-Yuan Tsai, Chu-Pei (TW); Chia-Shiung Tsai, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 320 days.

(21) Appl. No.: 14/471,101

(22) Filed: Aug. 28, 2014

(65) Prior Publication Data
US 2016/0064664 A1    Mar. 3, 2016

(51) Int. Cl.
*H01L 45/00* (2006.01)
(52) U.S. Cl.
CPC ........... *H01L 45/146* (2013.01); *H01L 45/08* (2013.01); *H01L 45/12* (2013.01); *H01L 45/1233* (2013.01); *H01L 45/1675* (2013.01)
(58) Field of Classification Search
CPC .................................................. H01L 45/08
See application file for complete search history.

(56) References Cited

U.S. PATENT DOCUMENTS

| 8,872,149 B1* | 10/2014 | Hsieh | H01L 45/04 257/2 |
| 2005/0243630 A1* | 11/2005 | Hsu | G11C 13/0007 365/222 |
| 2006/0043452 A1* | 3/2006 | Ueda | H01L 28/55 257/310 |
| 2007/0029676 A1* | 2/2007 | Takaura | G11C 13/0004 257/758 |
| 2008/0078985 A1* | 4/2008 | Meyer | G11C 13/02 257/6 |

(Continued)

FOREIGN PATENT DOCUMENTS

| JP | 2009218260 A | * | 9/2009 |
| KR | 20100078808 A |  | 7/2010 |

OTHER PUBLICATIONS

English Translation of Korean Office Action dated Dec. 15, 2015 for co-pending Korean application No. 10-2014-0184235.

*Primary Examiner* — Tucker J Wright
*Assistant Examiner* — Christopher A Culbert
(74) *Attorney, Agent, or Firm* — Eschweiler & Potashnik, LLC

(57) ABSTRACT

An integrated circuit or semiconductor structure of a resistive random access memory (RRAM) cell is provided. The RRAM cell includes a bottom electrode and a data storage region having a variable resistance arranged over the bottom electrode. Further, the RRAM cell includes a diffusion barrier layer arranged over the data storage region, an ion reservoir region arranged over the diffusion barrier layer, and a top electrode arranged over the ion reservoir region. A method for manufacture the integrated circuit or semiconductor structure of the RRAM cell is also provided.

20 Claims, 8 Drawing Sheets

(56) References Cited

U.S. PATENT DOCUMENTS

| | | |
|---|---|---|
| 2010/0019219 A1 | 1/2010 | Lee |
| 2010/0065803 A1 | 3/2010 | Choi et al. |
| 2011/0227026 A1* | 9/2011 | Sekar ................. G11C 13/0007 |
| | | 257/4 |
| 2013/0005148 A1* | 1/2013 | Sonoda ............. H01L 21/31053 |
| | | 438/692 |
| 2013/0149815 A1* | 6/2013 | Murase ................... H01L 45/08 |
| | | 438/104 |
| 2013/0187112 A1* | 7/2013 | Kuniya ............... H01L 27/2481 |
| | | 257/2 |
| 2013/0214234 A1* | 8/2013 | Gopalan ............... H01L 45/085 |
| | | 257/3 |

* cited by examiner

HIGH K SCHEME TO IMPROVE RETENTION PERFORMANCE OF RESISTIVE RANDOM ACCESS MEMORY (RRAM)

BACKGROUND

Many modern day electronic devices contain electronic memory configured to store data. Electronic memory may be volatile memory or non-volatile memory. Non-volatile memory is able to store data when power is removed, whereas volatile memory is not. Resistive random access memory (RRAM) is one promising candidate for next generation non-volatile memory technology due to its simple structure and its compatibility with complementary metal-oxide-semiconductor (CMOS) logic fabrication processes. An RRAM cell includes a resistive data storage layer vertically located between two electrodes within back-end-of-the-line (BEOL) metallization layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
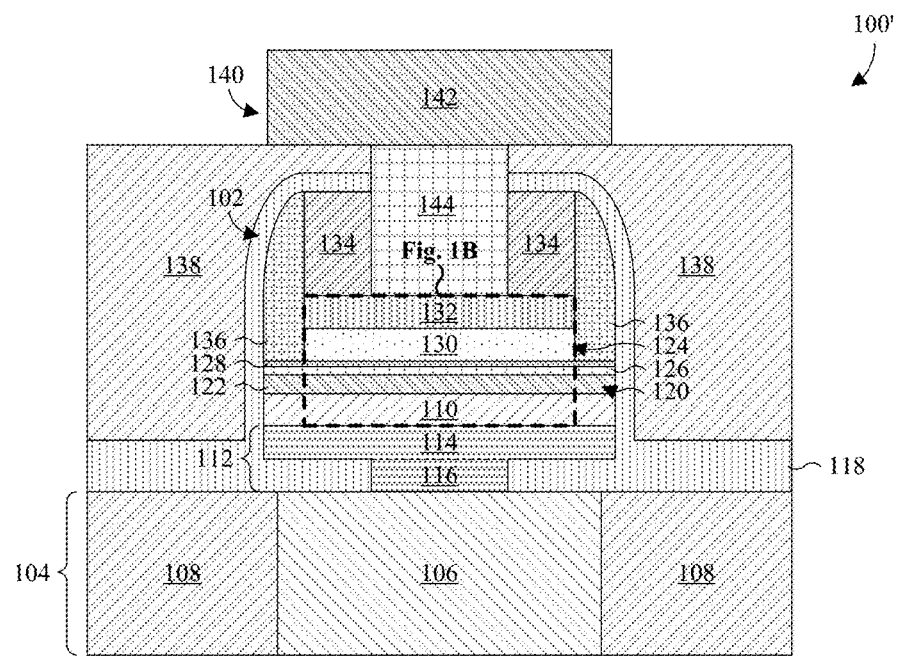
FIG. 1A illustrates a cross-sectional view of some embodiments of a semiconductor structure or integrated circuit of a resistive random access memory (RRAM) cell with a diffusion barrier layer between ion reservoir and data storage regions.
Figure 1B:
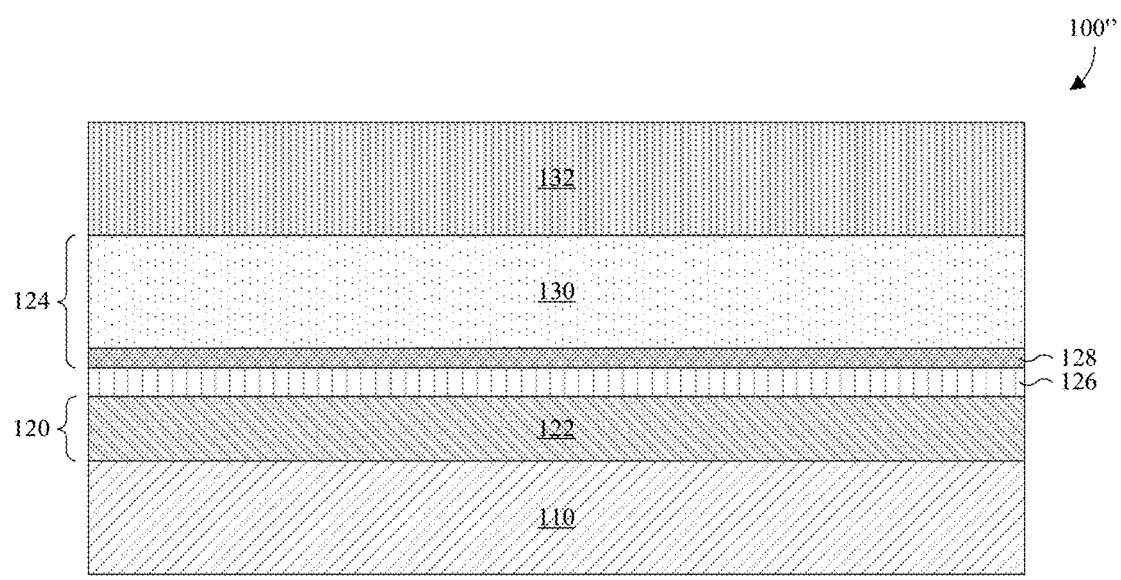
FIG. 1B illustrates an enlarged, cross-sectional view of some embodiments of the diffusion barrier layer and the ion reservoir and data storage regions of FIG. 1A.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A resistive random access memory (RRAM) cell includes a data storage region (e.g., comprising a region of a high κ layer) arranged between top and bottom electrodes. A variable resistance of the data storage region represents a data unit, such as a bit of data. Depending on a voltage applied between the top and bottom electrodes, the variable resistance undergoes a reversible change between a high resistance state and a low resistance state corresponding to data states of the data unit. The high resistance state is high in that the variable resistance exceeds a threshold, and the low resistance state is low in that the variable resistance is below the threshold.

One type of RRAM cell employs oxygen vacancies to form conductive paths. The oxygen-based RRAM cell includes an ion reservoir region (e.g., comprising a region of the high κ layer and a capping layer) arranged over the data storage region between the data storage region and the top electrode. The ion reservoir region is configured to store oxygen ions and facilitates resistance changes within the data storage region.

At the end of the RRAM manufacturing process, a forming voltage is applied across the top and bottom electrodes to initially form the conductive paths. This forming voltage knocks oxygen atoms out of a lattice of the data storage region, thereby forming localized oxygen vacancies. These localized oxygen vacancies tend to align to form the conductive paths which are relatively permanent and which extend through the data storage region. Thereafter, set or reset voltages can be applied across the top and bottom electrodes to change resistivity of the data storage region. When a reset voltage is applied, oxygen ions move back to the data storage region, thereby filling oxygen vacancies and breaking the conductive paths to increase resistivity. When a set voltage is applied, oxygen ions in the data storage region move to the ion reservoir region, thereby leaving oxygen vacancies and re-forming conductive paths to lower resistivity.

A challenge with an oxygen-based RRAM cell formed according to traditional approaches pertains to data retention at high operating temperatures (e.g., greater than about 160 degrees Celsius. When both operating at high temperatures and the conductive paths are formed (i.e., the RRAM cell is in the low resistance state), the oxygen ions slowly diffuse to the data storage region, thereby recombining with the oxygen vacancies and breaking the conductive paths to increase resistance. Similarly, when both operating at high temperatures and the conductive paths are broken (i.e., the RRAM cell is in the high resistance state), the oxygen ions slowly diffuse to the ion reservoir region, thereby leaving oxygen vacancies in the data storage layer and forming conductive paths to decrease resistivity. The diffusion is commonly seen during baking tests employed to verify data retention at high operating temperatures, such as between about 160-200 degrees Celsius.

The result of the diffusion is data corruption and poor or otherwise reduced data retention. Data retention depends upon persistence of resistance state of the variable resistance. The diffusion reduces the variable resistance to the low resistance state when in the high resistance state, and increases the variable resistance to the high resistance state when in the low resistance state. Since the data state of the data unit corresponds to the resistance state of the variable resistance, the data state of the data unit is toggled and hence corrupt.

In view of the foregoing, the present application is directed to an improved semiconductor structure for a RRAM cell that includes a diffusion barrier layer arranged between the data storage region and the ion reservoir region. The diffusion barrier layer acts as a physical barrier to prevent or otherwise slow the diffusion of ions used to form conductive paths, even during baking (e.g., between about 160-200 degrees Celsius) and at high operating temperatures (e.g., greater than about 160 degrees Celsius). Further, in some embodiments, the diffusion barrier layer has a negative charge to act as an electrostatic barrier and repel the ions away from the interface between the ion reservoir region and the data storage region. This further prevents or otherwise slows the diffusion of the ions. The diffusion barrier layer there reduces data corruption and improves data retention. Even more, in some embodiments, the thickness of the diffusion barrier layer is employed to control the thickness of the ion reservoir and data storage regions.

With reference to FIGS. 1A & B, cross-sectional views 100', 100' are respectively provided for some embodiments of a semiconductor structure or integrated circuit of a RRAM cell 102. The RRAM cell 102 is arranged over a semiconductor substrate (not shown) with a bottom interconnect structure 104 (partially shown) arranged between the RRAM cell 102 and the semiconductor substrate. The bottom interconnect structure 104 includes one or more bottom interconnect layers 106 disposed within a bottom inter-layer dielectric (ILD) layer 108. The bottom ILD layer 108 is or otherwise includes, for example, an extreme low-κ dielectric (i.e., a dielectric with a dielectric constant κ less than 2), and the bottom interconnect layers 106 are or otherwise include, for example, polysilicon or a metal, such as copper or tungsten.

A bottom electrode 110 of the RRAM cell 102 is arranged over the bottom interconnect structure 104. Further, the bottom electrode 110 is arranged in electrical communication with the bottom interconnect structure 104 through a bottom diffusion barrier layer 112 of the RRAM cell 102 arranged between the bottom electrode 110 and the bottom interconnect structure 104. The bottom diffusion barrier layer 112 prevents material from the bottom interconnect structure 104 from diffusing to the bottom electrode 110. The bottom diffusion barrier layer 112 includes a top region 114 and a bottom region 116 extending vertically down from the top region 114. The bottom region 116 includes a smaller footprint than the top region 114 and extends vertically down to the bottom interconnect structure 104 through an insulating structure 118 encapsulating the RRAM cell 102. The bottom electrode 110 and the bottom diffusion barrier layer 112 are or otherwise include conductive materials, such as, for example, polysilicon, titanium nitride, tantalum nitride, platinum, gold, iridium, ruthenium or tungsten. In some embodiments, the bottom diffusion barrier layer 112 and the bottom electrode 110 are the same material. The insulating structure 118 is or otherwise includes, for example, a dielectric material, such as silicon dioxide or silicon nitride.

Arranged over the bottom electrode 110, a data storage region 120 of the RRAM cell 102 stores a unit of data, such as a bit. The data storage region 120 includes a high κ data storage layer 122 (i.e., a data storage layer with a dielectric constant κ greater than 3.9) having a variable resistance representing the data unit. Depending upon the voltage applied across the data storage region 120, the variable resistance can be changed between different resistance states corresponding to different data states of the unit of data. The high κ data storage layer 122 is or otherwise includes, for example, a metal oxide, such as hafnium oxide (e.g., $HfO_2$) and/or hafnium aluminum oxide (e.g., HfAlO). Further, the mass of the aluminum in the hafnium aluminum oxide is, for example, between about 0 and 50 percent of the combined mass of the aluminum and the hafnium. The high κ data storage layer 122 and/or the data storage region 120 are, for example, about 2-3.5 nanometers thick.

An ion reservoir region 124 of the RRAM cell 102 is arranged over the data storage region 120 with a top diffusion barrier layer 126 of the RRAM cell 102 arranged between the data storage and ion reservoir regions 120, 124. The ion reservoir region 124 stores ions, such as oxygen ions, to facilitate resistance changes within the data storage region 120 and is, for example, 1-3 nanometers thick. The ion reservoir region 124 includes a high κ reservoir layer 128 (i.e., a reservoir layer with a dielectric constant κ greater than 3.9) and a capping layer 130 arranged over the high κ reservoir layer 128 with a smaller footprint than the high κ reservoir layer 128. The high κ reservoir layer 128 is or otherwise includes, for example, a metal oxide, such as hafnium oxide (e.g., $HfO_2$) or hafnium aluminum oxide. Further, the high κ reservoir layer 128 is, for example, about 0.5-1.5 nanometers thick and/or is, for example, about 0.3-0.75 times the thickness of the high κ data storage layer 122. The capping layer 130 is or otherwise includes, for example, a metal or a metal oxide, such as titanium, hafnium, or aluminum. Further, capping layer 130 is low in oxygen concentration relative to the high κ reservoir layer 128 and/or the high κ data storage layer 122.

The top diffusion barrier layer 126 prevents or otherwise slows material from diffusing between the ion reservoir and data storage regions 120, 124. In some embodiments, the top diffusion barrier layer 126 includes more negative charge than the high κ data storage and reservoir layers 122, 128 to further slow diffusion. The top diffusion barrier layer 126 is, for example, about 3.75 more negative than the high κ data storage and reservoir layers 122, 128. The top diffusion barrier layer 126 has, for example, a charge of $-1.755 \times 10^{13}$ coulombs per centimeter squared, whereas the high κ data storage and reservoir layers 122, 128 have a charge of $-4.67 \times 10^{12}$ coulombs per centimeter squared. The top diffusion barrier layer 126 is or otherwise includes, for example, aluminum oxide (e.g., $Al_2O_3$) and/or silicon dioxide. Further, the top diffusion barrier layer 126 is, for example, about 0.5-1.5 nanometers thick and/or is, for example, about 0.3-0.75 times the thickness of the high κ data storage layer 122. As discussed hereafter, the top diffusion barrier layer 126 improves data retention.

A top electrode 132 of the RRAM cell 102 is arranged over the capping layer 130, and a hard mask layer 134 of the RRAM cell 102 is arranged over the capping layer 130. The hard mask layer 134 is residual material from the manufacture of the RRAM cell 102. The top electrode 132 is or otherwise includes a conductive material, such as, for example, polysilicon, titanium nitride, tantalum nitride, platinum, gold, iridium, ruthenium or tungsten. Further, the hard mask layer 134 is or otherwise includes, for example, silicon nitride.

A spacer layer 136 of the RRAM cell 102 surrounds the capping layer 130, the hard mask layer 134, and the top electrode 132 along sidewalls of the capping layer 130, the hard mask layer 134, and the top electrode 132. The spacer layer 136 was used during the manufacture of the RRAM cell 102 to define the size of the reduced foot print of the capping layer 130, the top electrode 132, and the hard mask layer 134 relative to the bottom electrode 110, the high κ layers 122, 128, and the diffusion barrier layers 112, 126. The spacer layer 136 is or otherwise includes, for example, silicon nitride or a multilayer oxide-nitride-oxide film.

A top ILD layer 138 is arranged over and around the insulating structure 118, and a top interconnect structure 140 is arranged over and within the top ILD layer 138. The top interconnect structure 140 includes a top interconnect layer 142, and a top via layer 144 extending vertically down from the top interconnect layer 142 to the top electrode 132 through the insulating structure 118 and the hard mask layer 134. The top via layer 144 electrically connects the top electrode 132 to the top interconnect layer 142. The top ILD layer 138 is or otherwise includes, for example, an extreme low-κ dielectric (i.e., a dielectric with a dielectric constant κ less than 2). The top interconnect layer 142 and the top via layer 142 are or otherwise include, for example, a metal, such as copper or tungsten.

In operation of the RRAM cell 102, the data unit of the data storage region 120 is represented by the variable resistance of the data storage region 120. The variable resistance of the data storage region 120 is manipulated through application of a voltage between the top and bottom electrodes 110, 132 to change the state of the data unit. Depending on a voltage applied between the top and bottom electrodes, the variable resistance undergoes a reversible change between a high resistance state and a low resistance state corresponding to data states of the data unit. The high resistance state is high in that the variable resistance exceeds a threshold, and the low resistance state is low in that the variable resistance is below the threshold.

In some embodiments, such as where the RRAM cell 102 is an oxygen-based RRAM cell, the RRAM cell 102 employs oxygen vacancies to manipulate the resistance of the data storage region 120. An oxygen vacancy is a point defect in a ferroelectric material which carries an electric charge equal and opposite to two electrons. When a set voltage is applied across the top and bottom electrodes 110, 132, oxygen ions in the data storage region 120 move through the top diffusion barrier layer 126 to the ion reservoir region 124, thereby re-forming conductive paths (initially formed by a form voltage) from oxygen vacancies and switching the variable resistance to the low resistance state. The set voltage is, for example, a positive voltage. When a reset voltage is applied across the top and bottom electrodes 110, 132, the oxygen ions move back to the data storage region 120 through the top diffusion barrier layer 126, thereby filling the oxygen vacancies and switching the variable resistance to the high resistance state. The reset voltage is, for example, a negative voltage.

As described above, diffusion is a challenge for traditionally formed RRAM cells at high operating temperatures (e.g., greater than about 160 degrees Celsius). In traditional RRAM cells, the oxygen ions slowly diffuse back to the data storage region 120 when the conductive paths are formed and slowly diffuse back to the ion reservoir region 124 when the conductive paths are broken. As the diffusion occurs, the variable resistance either increases or decreases eventually toggling the state of the variable resistance between the high and low resistivity states. This undesirably changes the state of the data unit represented by the variable resistance, thereby resulting in data corruption and reduced data retention.

The RRAM cell 102 of the present disclosure improves on traditional RRAM cells with the addition of the top diffusion barrier layer 126 between the data storage region 120 and the ion reservoir region 124. The top diffusion barrier layer 126 provides a physical barrier to advantageously slow or eliminate the diffusion of oxygen ions between the data storage and ion reservoir regions 120, 124. Further, in embodiments where the top diffusion barrier layer 126 has a negative charge trapped on it, the top diffusion barrier layer 126 further provides an electrostatic barrier to advantageously repel the oxygen ions and further slow or eliminate the diffusion of oxygen ions between the data storage and ion reservoir regions 120, 124. By slowing or eliminating the diffusion of oxygen ions, data retention is improved and the likelihood of data corruption is reduced.

While the benefits of the top diffusion barrier layer 126 were described in connection with the diffusion of oxygen ions, it is to be understood that the top diffusion barrier layer 126 can be employed to prevent the diffusion of other types of ions and/or material. The present disclosure is not to be construed as being limited to a top diffusion barrier layer 126 for only oxygen ions. Rather, the present disclosure is directed to a top diffusion barrier layer 126 for other types of ion and/or material use to form conductive paths in other types of RRAM cells.

Figure 2:
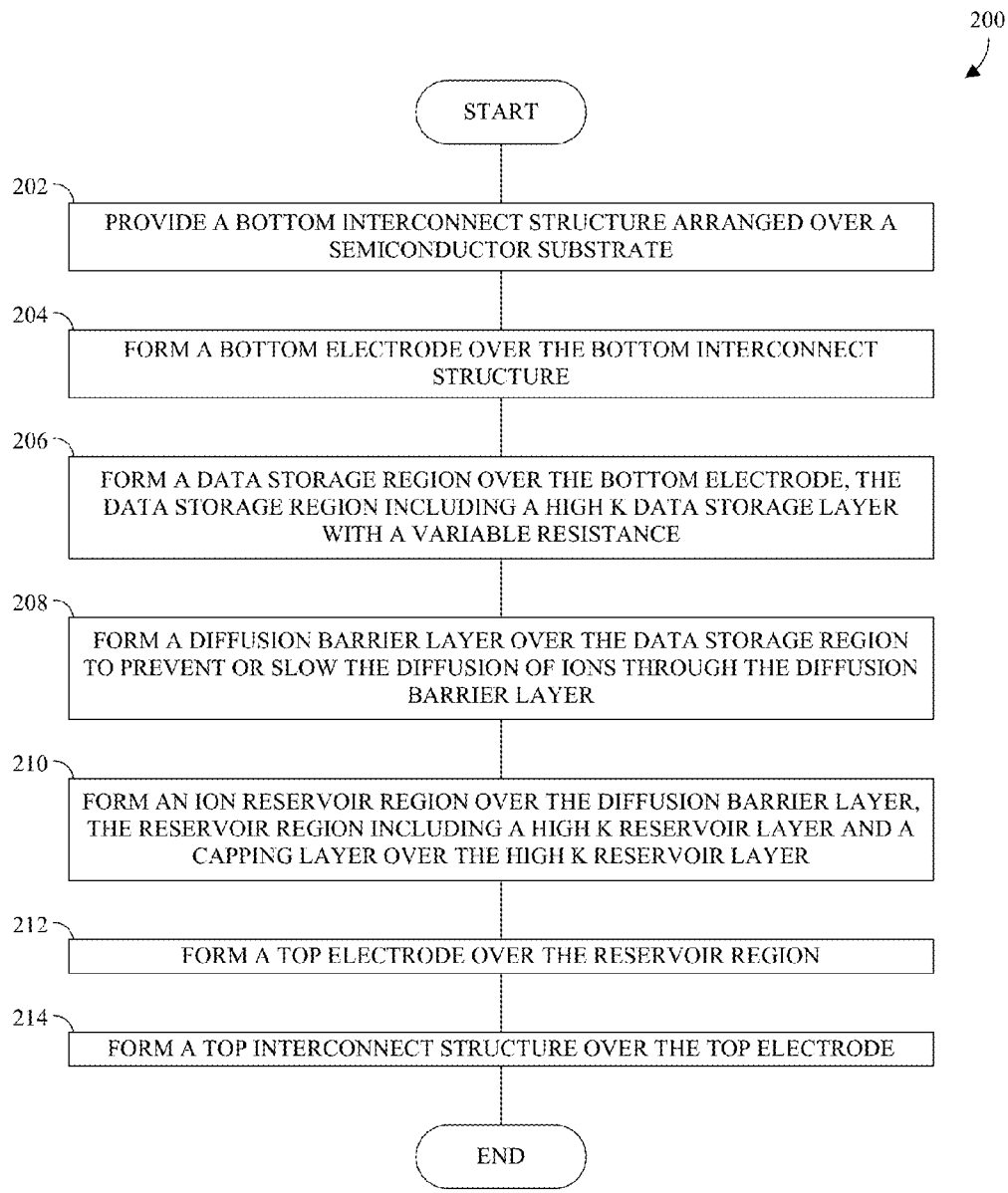
FIG. 2 illustrates a flowchart of some embodiments of a method for manufacturing a semiconductor structure or integrated circuit of a RRAM cell with a diffusion barrier layer between ion reservoir and data storage regions.

With reference to FIG. 2, a flow chart 200 provides some embodiments of a method for manufacturing a semiconductor structure or integrated circuit of a RRAM cell with a diffusion barrier layer between ion reservoir and data storage regions. An example of the RRAM cell is shown in FIGS. 1A & B.

According to the method, a bottom interconnect structure arranged over a semiconductor substrate is provided (Action 202).

A bottom electrode is formed (Action 204) over the bottom interconnect structure.

A data storage region is formed (Action 206) over the bottom electrode. The data storage region includes a high κ data storage layer with a variable resistance.

A diffusion barrier layer is formed (Action 208) over the data storage region to prevent or slow the diffusion of ions through the diffusion barrier layer. Advantageously, by slowing or preventing the diffusion of ions through the diffusion barrier layer, data retention is improved and data corruption is reduced. A predetermined amount of negative charge can be trapped on the diffusion barrier layer to help slow diffusion.

An ion reservoir region is formed (Action 210) over the diffusion barrier layer. The ion reservoir region includes a high κ reservoir layer and a capping layer over the high κ reservoir layer.

A top electrode is formed (Action 212) over the reservoir region.

A top interconnect structure is formed (Action 214) over the top electrode.

While the disclosed methods (e.g., the method described by the flowchart 200) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 3-13, cross-sectional views of some embodiments of a semiconductor structure or integrated circuit of a RRAM cell at various stages of manufacture are provided to illustrate the method. Although FIGS. 3-13 are described in relation to the method, it will be appreciated that the structures disclosed in FIGS. 3-13 are not limited to the method, but instead may stand alone as structures independent of the method. Similarly, although the method is described in relation to FIGS. 3-13, it will be appreciated that the method is not limited to the structures disclosed in FIGS. 3-13, but instead may stand alone independent of the structures disclosed in FIGS. 3-13.

FIGS. 3-9 illustrate cross-sectional views 300-800 of some embodiments corresponding to Actions 202-212.

Figure 3:
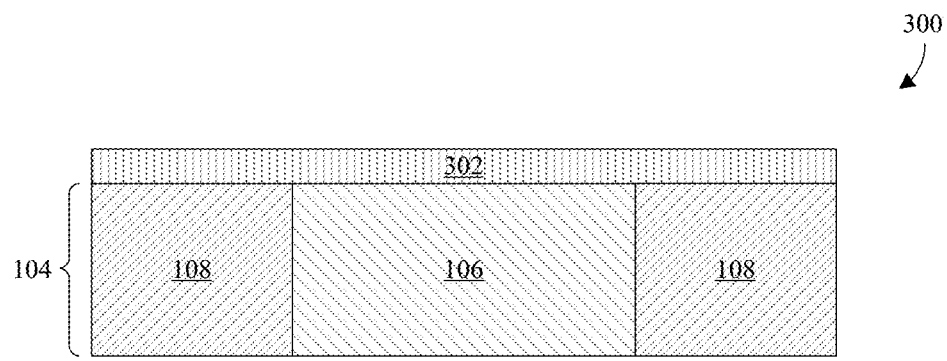
FIGS. 3-13 illustrate a series of cross-sectional views of some embodiments of a semiconductor structure or integrated circuit of a RRAM cell at various stages of manufacture, the RRAM cell including a diffusion barrier layer between ion reservoir and data storage regions.

As shown by FIG. 3, a bottom interconnect structure 104 (partially shown) arranged over a semiconductor substrate (not shown) is provided. The bottom interconnect structure 104 includes one or more bottom interconnect layers 106 disposed within a bottom ILD layer 108. The bottom ILD layer 108 is or otherwise includes, for example, an extreme low-κ dielectric, and the bottom interconnect layers 106 are or otherwise include, for example, polysilicon or a metal, such as copper or tungsten.

Also shown by FIG. 3, a bottom insulating layer 302 is formed over the bottom interconnect structure 104. The bottom insulating layer 302 is or otherwise includes, for example, a dielectric material, such as, for example, silicon dioxide or silicon nitride.

Figure 4:
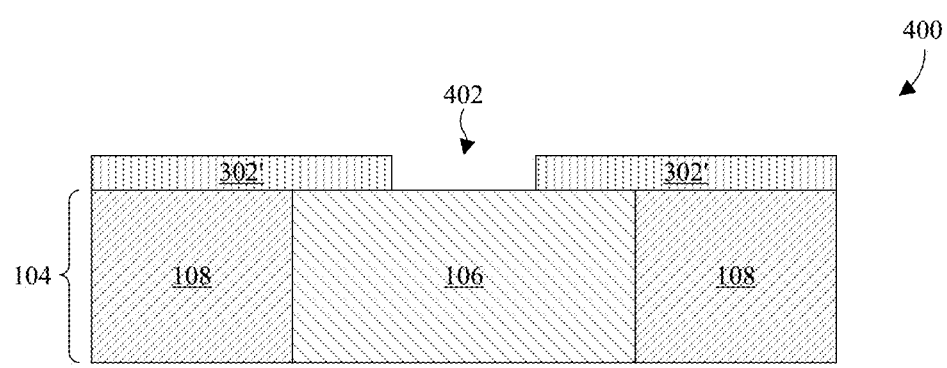

As shown by FIG. 4, a first etch is performed through the bottom insulating layer 302 to form an insulating hole 402 exposing one of the bottom interconnect layers 106.

Figure 5:
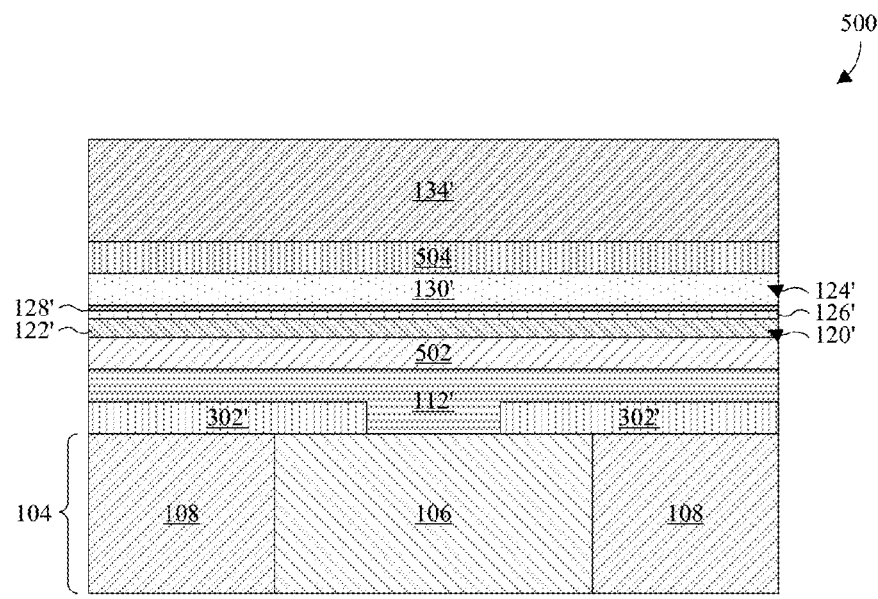

As shown by FIG. 5, a bottom diffusion barrier layer 112' is formed over the remaining bottom insulating layer 302' to fill the insulating hole 402 and coat a top surface of the remaining bottom insulating layer 302'. The bottom diffusion barrier layer 112' is formed by, for example, a deposition technique, such as chemical vapor deposition and physical vapor deposition. The bottom diffusion barrier layer 112' is or otherwise includes, for example, a conductive material, such as polysilicon, titanium nitride, tantalum nitride, platinum, gold, iridium, ruthenium or tungsten.

Also shown by FIG. 5, a bottom electrode layer 502 is formed over the bottom diffusion barrier layer 112'. In some embodiments, the bottom electrode layer 502 is formed by an atomic layer deposition (ALD) process. The bottom electrode layer 502 is or otherwise includes, for example, a conductive material, such as polysilicon, titanium nitride, tantalum nitride, platinum, gold, iridium, ruthenium or tungsten. In some embodiments, the bottom diffusion barrier layer 112' and the bottom electrode layer 502 are or otherwise include the same conductive material, and/or are formed from the same deposition.

Also shown by FIG. 5, a data storage region 120' having a variable resistance representing a unit of data, such as a bit of data, is formed over the bottom electrode layer 502. The formation of the data storage region 120' includes forming a high κ data storage layer 122' having a variable resistance by, for example, an ALD process. Depending upon the voltage applied across the data storage region 120', and hence the data storage layer 122', the variable resistance of the data storage region 120' switches between different resistance states corresponding to different data states of the data unit. The data storage region 120' and/or the high κ data storage layer 122' are or otherwise include, for example, a metal oxide, such as hafnium oxide and/or hafnium aluminum oxide. The mass of the aluminum in the hafnium aluminum oxide is, for example, between about 0 and 50 percent of the combined mass of the aluminum and the hafnium. Further, the data storage region 120' and/or the high κ data storage layer 122' are, for example, about 2-3.5 nanometers thick.

Also shown by FIG. 5, a top diffusion barrier layer 126' is formed over the data storage region 120' by, for example, an ALD process. The top diffusion barrier layer 126' prevents or otherwise slows material, such as oxygen ions, from diffusing through the top diffusion barrier layer 126'. In some embodiments, the top diffusion barrier layer 126' includes negative charge to repel ions away from the diffusion barrier layer 126'. The negative charge arises, for example, by the negative charge high κ property because of defects which form during the deposition process (e.g., O-Interstitial, Al-vacancies, etc.) and/or by a charging phenomenon at the interface between a high-K dielectric layer and a silicon oxide layer. Further, in some embodiments, the top diffusion barrier layer 126' is about 3.75 more negative than the high κ data storage layer 122'. For example, the top diffusion barrier layer 126' has a charge of $-1.755 \times 10^{13}$ coulombs per centimeter squared, whereas the high κ data storage layer 122' has a charge of $-4.67 \times 10^{12}$ coulombs per centimeter squared. The top diffusion barrier layer 126' is or otherwise includes, for example, aluminum oxide and/or silicon dioxide. Further, the top diffusion barrier layer 126' is, for example, about 0.5-1.5 nanometers thick and/or is, for example, about 0.3-0.75 times the thickness of the high κ data storage layer 122'.

Also shown by FIG. 5, an ion reservoir region 124' is formed over the top diffusion barrier layer 126'. The ion reservoir region 124' stores ions, such as oxygen ions, facilitating the switch of the data storage region 120' between different resistance states. The ion reservoir region 124 is, for example, 1-3 nanometers thick. The formation of the ion reservoir region 124' includes forming a high κ reservoir layer 128' over the top diffusion barrier layer 126' by, for example, an ALD process and forming a capping layer 130' over the high κ reservoir layer 128'. The high κ reservoir layer 128' is or otherwise includes, for example, a metal oxide, such as hafnium oxide or hafnium aluminum oxide. Further, the high κ reservoir layer 128' is, for example, about 0.5-1.5 nanometers thick and/or is, for example, about 0.3-0.75 times the thickness of the high κ data storage layer 122'. The capping layer 130' is or otherwise includes, for example, a metal or a metal oxide, such as titanium, hafnium, or aluminum, that is low in oxygen concentration relative to the high κ reservoir layer 128' and/or the high κ data storage layer 122'.

In some embodiments, the top diffusion barrier layer 126' is employed to control the thickness of the data storage region 120' and the ion reservoir region 124'. Namely, the data storage region and the reservoir region of a traditionally formed RRAM cell each include a region of a common high κ layer. The traditional reservoir region extends into the common high κ layer by a variable amount dependent on the operating parameters of the traditional RRAM cell. Hence, the thicknesses of the traditional data storage region and the traditional reservoir region are only approximately known at manufacture. The diffusion barrier layer 126' prevents the sharing of a high κ layer and defines a clear boundary between the data storage region 120' and the ion reservoir region 124'. This, in turn, allows the thickness of the data storage region 120' and the ion reservoir region 124' to be precisely set at manufacture based on the location of the diffusion barrier layer 126'.

Also shown by FIG. 5, a top electrode layer 504 is formed over the ion reservoir region 124'. In some embodiments, the top electrode layer 504 is formed by a chemical vapor deposition or a physical vapor deposition. The top electrode layer 504 is or otherwise includes, for example, a conductive material, such as polysilicon, titanium nitride, tantalum nitride, platinum, gold, iridium, ruthenium or tungsten.

Also shown by FIG. 5, a hard mask layer 134' is formed over the top electrode layer 504. The hard mask layer 134' is or otherwise includes, for example, silicon nitride or a multilayer nitride-oxide-nitride film.

Figure 6:
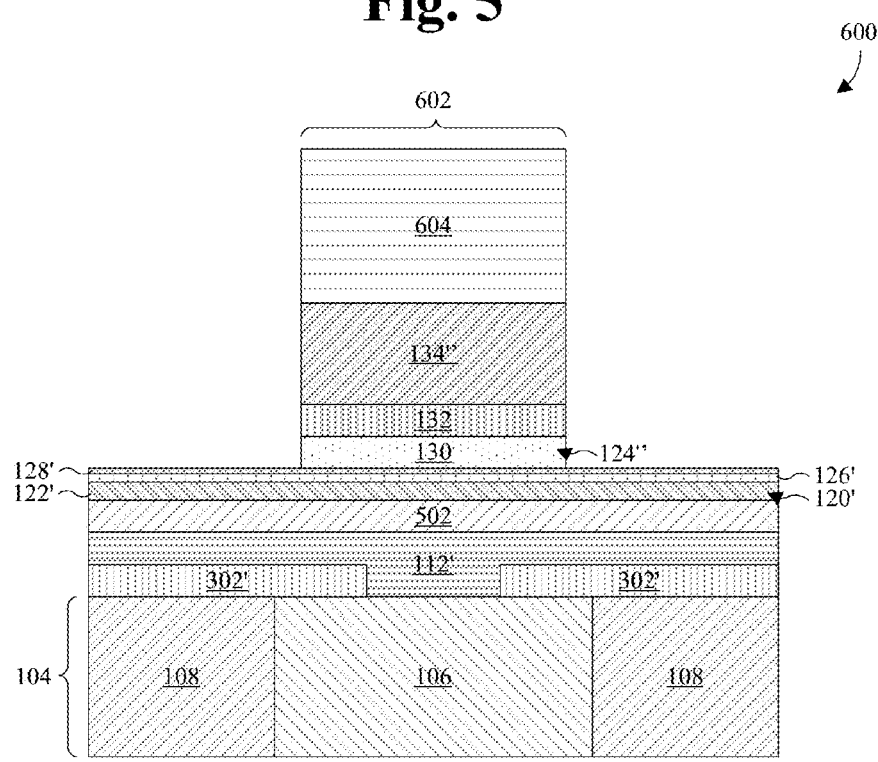

As shown by FIG. 6, a second etch is performed through the hard mask layer 134', the top electrode layer 504, and the capping layer 130' to remove peripheral portions of these layers 130, 134', 504 surrounding a RRAM cell core region 602. In performing the second etch, a top electrode 132 is formed from the top electrode layer 504. In some embodiments, performing the second etch includes forming a first photoresist layer over a top surface of the hard mask layer 134', patterning the photoresist layer, and applying an etchant to the patterned photoresist layer 604. Further, in some embodiments, the second etch includes a plurality of sub-etches.

Figure 7:
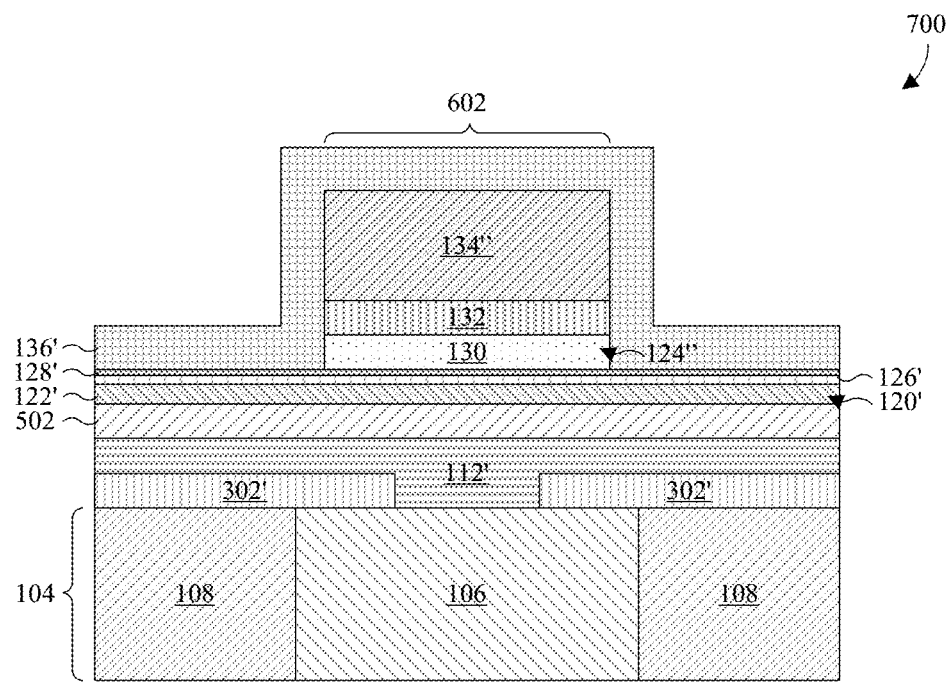

As shown by FIG. 7, a spacer layer 136' is conformally formed along the top surfaces of the high κ reservoir layer 128' and the remaining hard mask layer 134", and along sidewalls walls of the remaining ion reservoir region 124", the remaining hard mask layer 134", the top electrode 132, and the remaining capping layer 130. The spacer layer 136' is or otherwise includes, for example, silicon nitride or a multilayer oxide-nitride-oxide film. In some embodiments, the spacer layer 136' is or otherwise includes the same material as the remaining hard mask layer 134".

Figure 8:
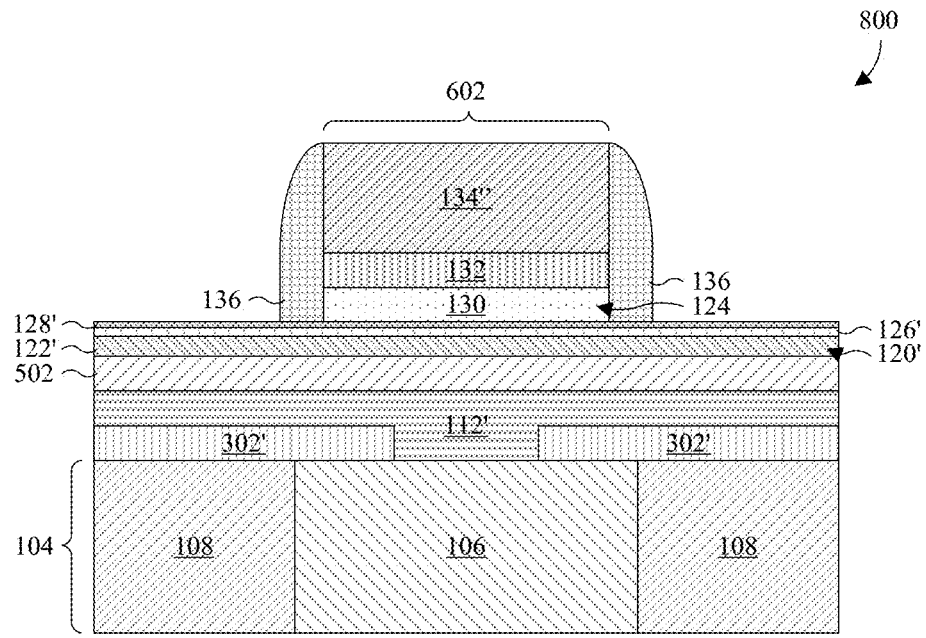

As shown by FIG. 8, a third etch is performed into the spacer layer 136' to remove horizontal stretches of the spacer layer 136' and leave those stretches lining sidewalls of the remaining hard mask layer 134", the top electrode 132, and the remaining capping layer 130. In some embodiments, the third etch is performed for a period of time sufficient to remove the approximate thickness of the spacer layer 136'.

Figure 9:
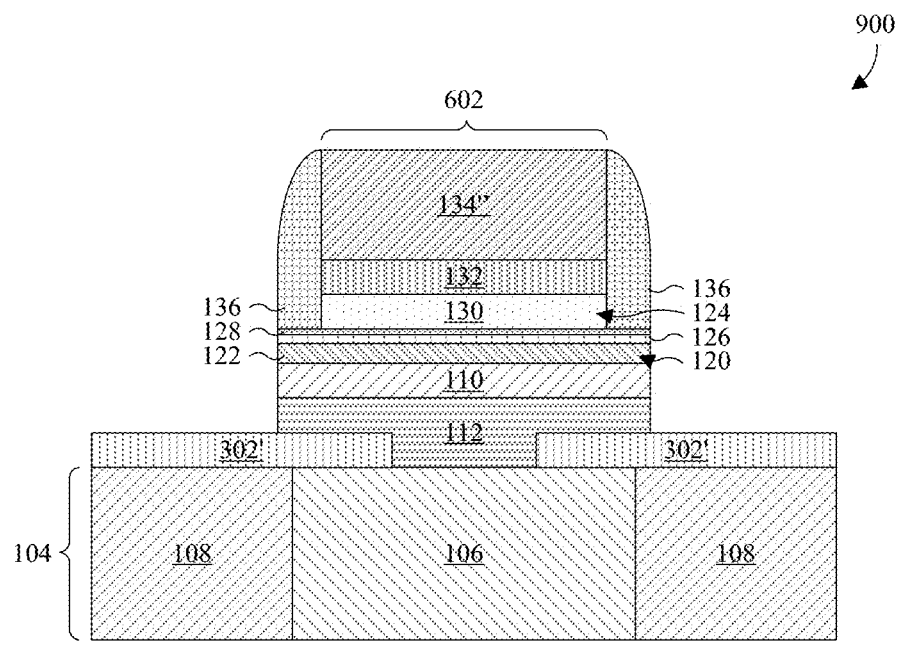

As shown by FIG. 9, a fourth etch is performed through the high κ reservoir layer 128', the top diffusion barrier layer 126', the high κ data storage layer 122', the bottom electrode layer 502, and the bottom diffusion barrier layer 112' to remove peripheral portions of these layers 112', 122', 126', 128', 502, unmasked by the remaining hard mask layer 134" and the remaining spacer layer 136. In performing the fourth etch, a bottom electrode 110 is formed from the bottom electrode layer 502.

FIGS. 10-13 illustrate cross-sectional views 700-1400 of some embodiments corresponding to Actions 214.

Figure 10:
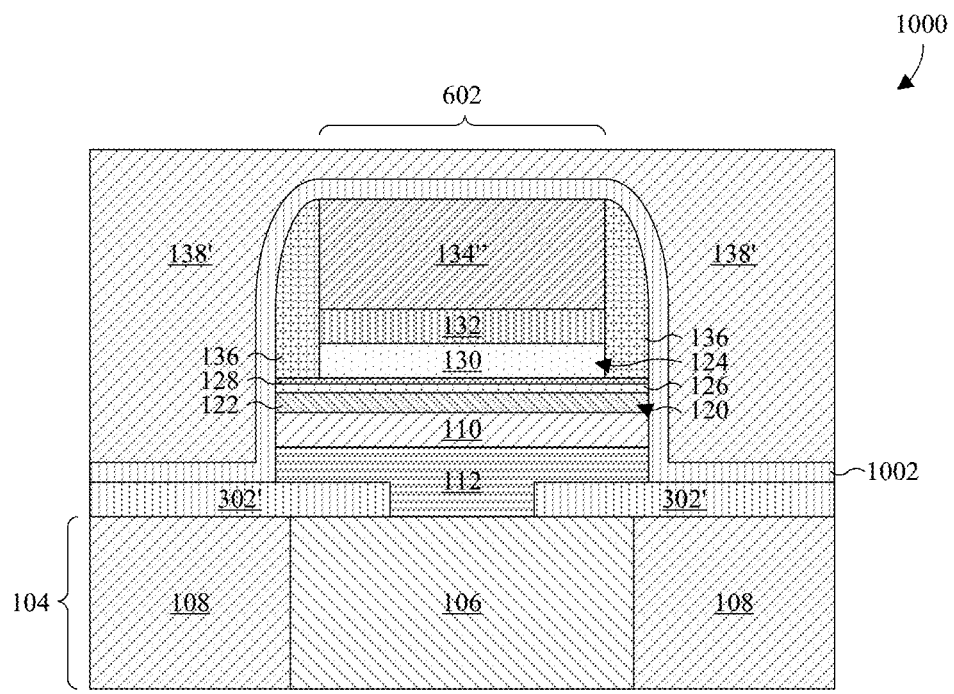

As shown by FIG. 10, a top insulating layer 1002 is conformally formed over the remaining bottom insulating layer 302', the remaining bottom diffusion barrier layer 112, the bottom electrode 110, the remaining high κ data storage layer 122, the top diffusion barrier layer 126, the remaining high κ reservoir layer 128, the remaining spacer layer 136, and the remaining hard mask layer 134". The top insulating layer 1002 is or otherwise includes, for example, a dielectric material, such as, for example, silicon dioxide or silicon nitride.

Also shown by FIG. 10, a top ILD layer 138' is formed over and around the top insulating layer 1002. The top ILD layer 138' has, for example, a planar top surface. Further, the top ILD layer 138' is or otherwise includes, for example, an extreme low-K dielectric.

Figure 11:
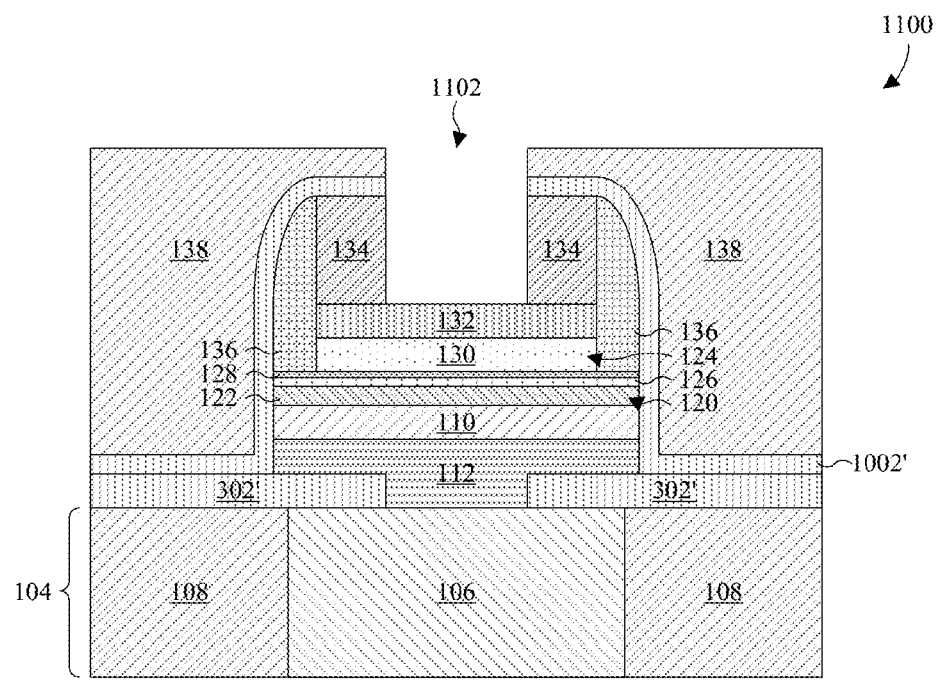

As shown by FIG. 11, a fifth etch is performed into the top ILD layer 138', the top insulating layer 1002, and the remaining hard mask layer 134" to form a top via hole 1102 exposing the top electrode 132.

Figure 12:
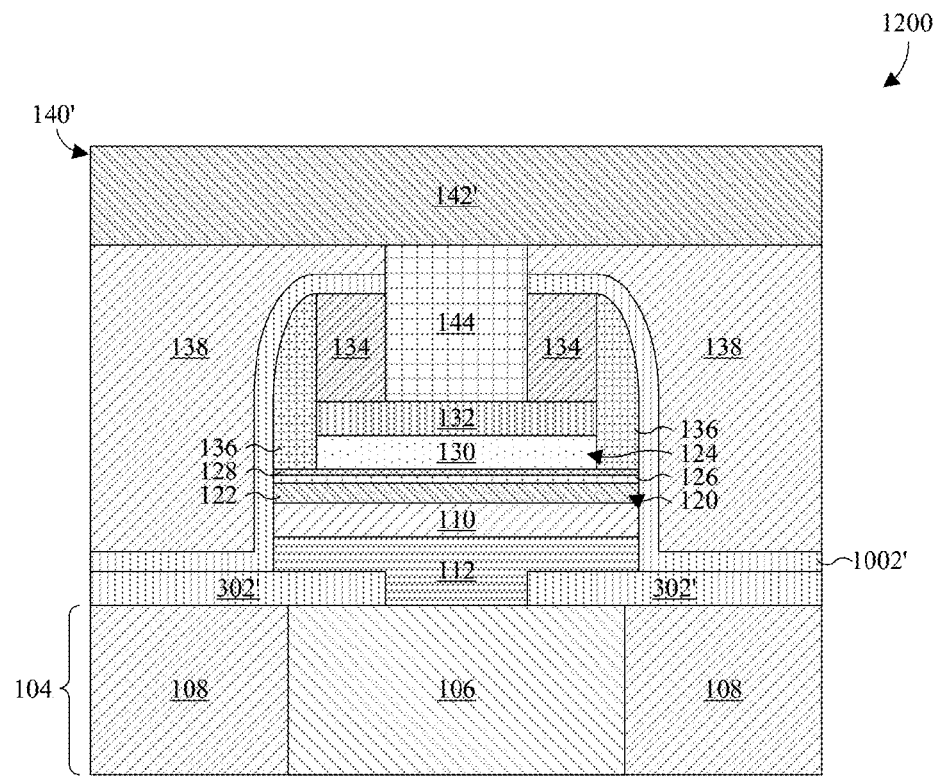

As shown by FIG. 12, a top interconnect structure 140' is formed over the remaining top ILD layer 138. The top interconnect structure 140' is formed by forming a top via layer 144 filling or otherwise lining the top via hole 1102 and forming a top interconnect layer 142' over the remaining top ILD layer 138 and the top via layer 144. In some embodiments, the top via layer 144 and the top interconnect layer 142' are formed as part of the same deposition. The top interconnect layer 142' and the top via layer 142 are or otherwise include, for example, a metal, such as copper or tungsten.

Figure 13:
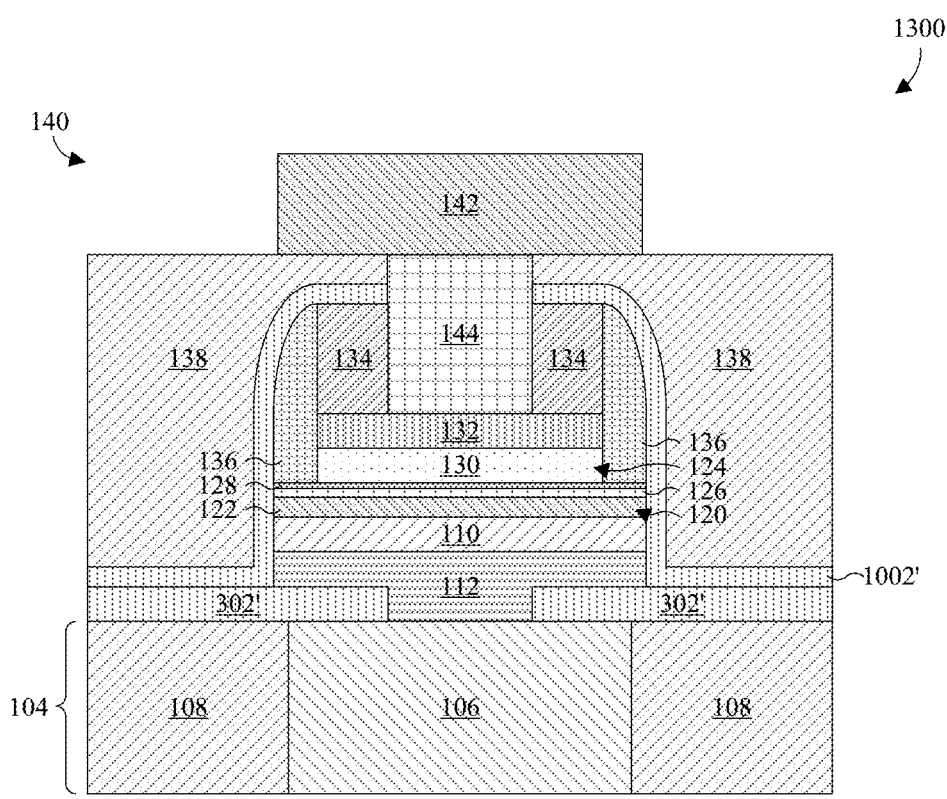

As shown by FIG. 13, a sixth etch is performed through select portions of the top interconnect layer 142' to form electrodes, interconnects, etc. in the top interconnect layer 142'.

Thus, as can be appreciated from above, the present disclosure provides an integrated circuit of a RRAM cell. The integrated circuit includes a bottom electrode and a data storage region having a variable resistance arranged over the bottom electrode. The integrated circuit further includes a diffusion barrier layer arranged over the data storage region, an ion reservoir region arranged over the diffusion barrier layer, and a top electrode arranged over the ion reservoir region.

In other embodiments, the present disclosure provides a method for manufacturing an integrated circuit of a RRAM cell. A bottom electrode is formed, and a data storage region having a variable resistance is formed over the bottom electrode. A diffusion barrier layer is formed over the data storage region, an ion reservoir region is formed over the diffusion barrier layer, and a top electrode is formed over the ion reservoir region.

In yet other embodiments, the present disclosure provides an integrated circuit of a RRAM cell. The integrated circuit includes a bottom electrode, a high κ data storage layer with a variable resistance and a dielectric constant exceeding 3.9, and a diffusion barrier layer arranged over the high κ data storage layer. The integrated circuit further includes a high κ reservoir layer with a dielectric constant exceeding 3.9, a capping layer low in oxygen concentration relative to the high κ reservoir layer, and a top electrode arranged over the capping layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit of a resistive random access memory (RRAM) cell, the integrated circuit comprising:

a bottom diffusion barrier layer, wherein a width of the bottom diffusion barrier layer decreases from top to bottom;
a bottom electrode overlying the bottom diffusion barrier layer;
a data storage region having a variable resistance and arranged over the bottom electrode;
a diffusion barrier layer arranged over the data storage region;
an ion reservoir region arranged over the diffusion barrier layer;
a top electrode arranged over the ion reservoir region;
a hard mask layer over the top electrode; and
an insulating layer extending conformally from contact with a sidewall of the bottom diffusion barrier layer to contact with a top surface of the hard mask layer, wherein the insulating layer is overhung by the bottom diffusion barrier layer and has a bottom surface even with that of the bottom diffusion barrier layer.

2. The integrated circuit according to claim 1, wherein the diffusion barrier layer has an electric charge that is more negative than electric charges respectively of the data storage region and the ion reservoir region.

3. The integrated circuit according to claim 1, wherein the diffusion barrier layer is configured to physically and electrostatically block diffusion of ions between the ion reservoir region and the data storage region.

4. The integrated circuit according to claim 1, wherein the diffusion barrier layer includes silicon oxide.

5. The integrated circuit according to claim 1, wherein the data storage region includes a high κ data storage layer with a variable resistance and a dielectric constant exceeding 3.9.

6. The integrated circuit according to claim 5, wherein the high κ data storage layer includes hafnium aluminum oxide, and wherein a mass of the aluminum in the hafnium aluminum oxide is between about 0 and 50 percent of a combined mass of the aluminum and the hafnium.

7. The integrated circuit according to claim 1, wherein the ion reservoir region includes:
a high κ reservoir layer with a dielectric constant exceeding 3.9; and
a capping layer low in oxygen concentration relative to the high κ reservoir layer.

8. The integrated circuit according to claim 1, wherein the bottom diffusion barrier layer has a T-shaped profile, wherein the integrated circuit further comprises a pair of spacer segments overlying the ion reservoir region, wherein the hard mask layer and the top electrode are sandwiched between the spacer segments, and wherein the insulating layer conformally lines and contacts sidewalls respectively of the bottom diffusion barrier layer, the bottom electrode, the data storage region, the diffusion barrier layer, the ion reservoir region, and the spacer segments.

9. The integrated circuit according to claim 1, wherein the insulating layer comprises a first insulating sidewall and a second insulating sidewall opposite the first insulating sidewall, wherein a distance between the first insulating sidewall and the second insulating sidewall is constant from the sidewall of the bottom diffusion barrier layer to the top surface of the hard mask layer, and wherein the second insulating sidewall directly contacts the sidewall of the bottom diffusion barrier layer and the top surface of the hard mask layer.

10. An integrated circuit of a resistive random access memory (RRAM) cell, the integrated circuit comprising:

a bottom diffusion barrier layer, wherein a bottom width of the bottom diffusion barrier layer is less than a top width of the bottom diffusion barrier layer;
a bottom electrode overlying the bottom diffusion barrier layer;
a high κ data storage layer with a variable resistance and a dielectric constant exceeding 3.9, wherein the high κ data storage layer is arranged over the bottom electrode and comprises a conductive path of oxygen vacancies extending through the high κ data storage layer;
a diffusion barrier layer arranged over the high κ data storage layer;
a high κ reservoir layer with a dielectric constant exceeding 3.9, wherein the high κ reservoir layer is arranged over the diffusion barrier layer, and wherein the high κ reservoir layer has a first thickness that is between a second thickness of the diffusion barrier layer and a third thickness of the high κ data storage layer;
a capping layer low in oxygen concentration relative to the high κ reservoir layer and arranged over the high κ reservoir layer;
a top electrode arranged over the capping layer; and
an insulation structure having a bottom surface even with that of the bottom diffusion barrier layer, wherein a first insulation portion of the insulation structure is overhung by the bottom diffusion barrier layer, wherein a second insulation portion of the insulation structure overhangs the top electrode, and wherein the insulation structure extends continuously from the first insulation portion to the second insulation portion.

11. The integrated circuit according to claim 10, wherein the diffusion barrier layer has an electric charge that is more negative than electric charges respectively of the high κ data storage and reservoir layers, and is configured to physically and electrostatically slow the diffusion of ions through the diffusion barrier layer, between the high κ data storage and reservoir layers.

12. The integrated circuit according to claim 11, wherein the diffusion barrier layer is a continuous layer of silicon dioxide, wherein the high κ reservoir layer is a continuous layer of hafnium oxide, and wherein the high κ data storage layer is a continuous layer of hafnium oxide.

13. The integrated circuit according to claim 11, wherein the high κ data storage layer is configured to undergo a reversible change between a high resistance state and a low resistance state depending on a voltage applied across the bottom and top electrodes.

14. The integrated circuit according to claim 10, wherein a bottom surface of the diffusion barrier layer and a top surface of the diffusion barrier layer respectively contact the high κ data storage layer and the high κ reservoir layer, wherein opposite sidewalls of the diffusion barrier layer are respectively aligned with opposite sidewalls of the high κ data storage layer, wherein the opposite sidewalls of the diffusion barrier layer are respectively aligned with opposite sidewalls of the high κ reservoir layer, and wherein the opposite sidewalls of the diffusion barrier layer are respectively aligned with opposite sidewalls of the bottom electrode.

15. The integrated circuit according to claim 14, wherein a bottom surface of the capping layer and a top surface of the capping layer respectively contact the high κ reservoir layer and the top electrode, wherein opposite sidewalls of the capping layer are respectively aligned with opposite sidewalls of the top electrode, and wherein the opposite sidewalls of the capping layer are laterally spaced between the opposite sidewalls of the high κ reservoir layer.

16. The integrated circuit according to claim 10, wherein the bottom diffusion barrier layer has a T-shaped profile, wherein the integrated circuit further comprises a hard mask over the top electrode and a spacer over the high κ reservoir layer, wherein the spacer has an outer sidewall aligned to an outer sidewall of the high κ reservoir layer, and further has an inner sidewall that is laterally spaced between the outer sidewall of the spacer and that laterally contacts the hard mask and the capping layer, wherein the insulation structure conformally lines and contacts sidewalls respectively of the bottom diffusion barrier layer, the bottom electrode, the high κ data storage layer, the diffusion barrier layer, and the spacer, and wherein the insulation structure conformally lines and contacts a top surface of the hard mask.

17. An integrated circuit of a resistive random access memory (RRAM) cell, the integrated circuit comprising:
   a bottom diffusion barrier layer with a T-shaped profile;
   a bottom electrode arranged over and contacting the bottom diffusion barrier layer;
   a high κ data storage layer arranged over and contacting the bottom electrode, wherein the high κ data storage layer has a variable resistance and a dielectric constant exceeding about 3.9;
   a top diffusion barrier layer arranged over and contacting the high κ data storage layer, wherein the top diffusion barrier layer has an electric charge that is more negative than that of the high κ data storage layer, and is configured to physically and electrostatically slow the diffusion of ions through the top diffusion barrier layer;
   a high κ reservoir layer arranged over and contacting the top diffusion barrier layer, wherein the high κ reservoir layer has a dielectric constant exceeding about 3.9 and an electric charge that is more positive than that of the top diffusion barrier layer;
   a capping layer arranged over and contacting the high κ reservoir layer, wherein the capping layer has a lower oxygen concentration than the high κ reservoir layer, and wherein the capping layer is a metal including titanium, hafnium, or aluminum;
   a top electrode arranged over and contacting the capping layer, wherein the top electrode includes platinum, gold, iridium, ruthenium, or tungsten;
   a hard mask layer arranged over and contacting the top electrode;
   a spacer layer arranged over and contacting the high κ reservoir layer, wherein the spacer layer has outer sidewalls respectively aligned to outer sidewalls of the high κ data storage layer, and further has inner sidewalls that are laterally spaced between the outer sidewalls of the spacer layer and that laterally contact the hard mask layer and the capping layer; and
   an insulating structure overhung by the bottom diffusion barrier layer and having a bottom surface even with that of the bottom diffusion barrier layer, wherein the insulating structure conformally lines and contacts sidewalls respectively of the bottom diffusion barrier layer, the bottom electrode, the high κ data storage layer, the top diffusion barrier layer, the high κ reservoir layer, and the spacer layer, and wherein the insulating structure conformally lines and contacts a top surface of the hard mask layer.

18. The integrated circuit according to claim 17, wherein the inner sidewalls of the spacer layer respectively contact outer sidewalls of the top electrode.

19. The integrated circuit according to claim 17, further comprising:
   a via arranged over and contacting the top electrode, wherein the via extends through the insulating structure and the hard mask layer, and wherein the via has opposite sidewalls respectively aligned to opposite sidewalls of the bottom diffusion barrier layer; and
   an interlayer dielectric (ILD) layer covering the insulating structure and laterally contacting a sidewall of the insulating structure, wherein the ILD layer is a different material than the insulating structure, and wherein a top surface of the ILD layer is even with a top surface of the via.

20. The integrated circuit according to claim 17, wherein the high κ reservoir layer and the top diffusion barrier layer each have a thickness of about 0.3-0.75 times a thickness of the high κ data storage layer.

* * * * *